(12) United States Patent
Mori

(10) Patent No.: US 10,408,893 B2
(45) Date of Patent: Sep. 10, 2019

(54) MAGNETIC SENSOR

(71) Applicant: Murata Manufacturing Co., Ltd., Nagaokakyo-shi, Kyoto-fu (JP)

(72) Inventor: Daisuke Mori, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 292 days.

(21) Appl. No.: 15/407,303

(22) Filed: Jan. 17, 2017

(65) Prior Publication Data

US 2017/0123017 A1 May 4, 2017

Related U.S. Application Data

(63) Continuation of application No. PCT/JP2015/068471, filed on Jun. 26, 2015.

(30) Foreign Application Priority Data

Jul. 25, 2014 (JP) .................................. 2014-151621

(51) Int. Cl.
*G01R 33/09* (2006.01)
*H01L 43/08* (2006.01)

(52) U.S. Cl.
CPC .............. *G01R 33/09* (2013.01); *H01L 43/08* (2013.01)

(58) Field of Classification Search
CPC .... G01R 33/09; G01R 15/205; G01R 33/025; G01R 33/072; G01R 33/0082; G01R 33/063; G01D 5/145; G01D 5/147; G01D 5/16

See application file for complete search history.

(56) References Cited

U.S. PATENT DOCUMENTS

| 7,358,723 B2* | 4/2008 | Hinz ...................... G01D 5/145 324/207.21 |
| 9,013,181 B2* | 4/2015 | Ausserlechner ....... B82Y 25/00 324/252 |
| 2004/0207400 A1* | 10/2004 | Witcraft ................. G01R 33/09 324/252 |
| 2015/0115949 A1 | 4/2015 | Itagaki |

FOREIGN PATENT DOCUMENTS

| JP | 09-102638 A | 4/1997 |
| JP | 11-274598 A | 10/1999 |
| JP | 2010-008160 A | 1/2010 |
| JP | 2012-088225 A | 5/2012 |
| WO | 2013/171977 A1 | 11/2013 |

OTHER PUBLICATIONS

Official Communication issued in corresponding International Application PCT/JP2015/068471, dated Sep. 8, 2015.

* cited by examiner

Primary Examiner — Son T Le
(74) Attorney, Agent, or Firm — Keating & Bennett, LLP

(57) ABSTRACT

A magnetic sensor includes first magnetoresistive elements and second magnetoresistive elements. The rates of change of resistance of the first magnetoresistive elements are higher than the rates of change of resistance of the second magnetoresistive elements. The second magnetoresistive elements each include a plurality of unit patterns that are arranged along an imaginary circle or an imaginary polygon in plan view and the unit patterns each include a plurality of bent portions and a folded back shape. The plurality of unit patterns are connected to each other in a direction that encloses a region around the center of the imaginary circle or imaginary polygon.

19 Claims, 13 Drawing Sheets

MAGNETIC SENSOR

CROSS REFERENCE TO RELATED APPLICATIONS

This application claims the benefit of priority to Japanese Patent Application No. 2014-151621 filed on Jul. 25, 2014 and is a Continuation Application of PCT Application No. PCT/JP2015/068471 filed on Jun. 26, 2015. The entire contents of each application are hereby incorporated herein by reference.

BACKGROUND OF THE INVENTION

1. Field of the Invention

The present invention relates to a magnetic sensor and, in particular, relates to a magnetic sensor that includes a magnetoresistive element.

2. Description of the Related Art

Japanese Unexamined Patent Application Publication No. 11-274598, Japanese Unexamined Patent Application Publication No. 9-102638 and International Publication No. 2013/171977 disclose magnetic sensors that improve the isotropy of magnetic field detection.

The pattern of a magnetoresistive element of the magnetic sensor disclosed in Japanese Unexamined Patent Application Publication No. 11-274598 has a spiral shape. Both ends of the spiral-shaped pattern are formed at the outermost parts located on opposite sides to each other. The pattern of the magnetoresistive element is substantially formed of curved portions.

In the magnetic sensor disclosed in Japanese Unexamined Patent Application Publication No. 9-102638, a magnetoresistive element has a circular shape formed by being wound through a plurality of turns in a spiral shape, and is formed through film deposition so as to be isotropic with respect to an external magnetic field.

In the magnetic sensor disclosed in International Publication No. 2013/171977, each of a plurality of magnetoresistive elements of a bridge circuit is connected so as to be successively folded back, with plural portions that extend in a direction that is substantially orthogonal to the overall magnetic field direction being arrayed in parallel at specific intervals, and each of the plural portions is connected to be successively folded back, formed in a zigzag state that is electrically connected, with multiple portions that extend in the magnetic field detection direction being arrayed parallel at specific intervals.

In Japanese Unexamined Patent Application Publication No. 11-274598 and Japanese Unexamined Patent Application Publication No. 9-102638, there is no description or suggestion of forming a magnetic sensor by using a plurality of magnetoresistive elements. The isotropy of magnetic field detection could be further improved in the magnetic sensor disclosed in International Publication No. 2013/171977.

SUMMARY OF THE INVENTION

A magnetic sensor according to a preferred embodiment of the present invention includes a plurality of magnetoresistive elements that are electrically connected to each other and define a bridge circuit. The plurality of magnetoresistive elements includes a first magnetoresistive element and a second magnetoresistive element. A rate of change of resistance of the first magnetoresistive element is higher than a rate of change of resistance of the second magnetoresistive element. The second magnetoresistive element includes a plurality of unit patterns that are arranged along an imaginary circle or an imaginary polygon in plan view and the unit patterns each include a plurality of bent portions and a folded back shape. The plurality of unit patterns are connected to each other in a direction that encloses a region around the center of the imaginary circle or imaginary polygon.

In a preferred embodiment of the present invention, the unit patterns do not include any linear extending portions having a length of about 10 μm or more.

In a preferred embodiment of the present invention, each unit pattern is bent in each of the plurality of bent portions.

In a preferred embodiment of the present invention, each unit pattern is curved in each of the plurality of bent portions.

In a preferred embodiment of the present invention, in plan view, the plurality of unit patterns each include a plurality of arc-shaped portions that are respectively located on a plurality of concentric circles, which are concentric with the imaginary circle, and a plurality of linear extending portions that extend in a radiating manner from the center of the imaginary circle and connect every two adjacent arc-shaped portions, which are adjacent to each other in a radial direction of the imaginary circle, to each other.

In a preferred embodiment of the present invention, the plurality of unit patterns are connected to each other so as to enclose a region around the center of the imaginary circle in a layered manner.

According to various preferred embodiments of the present invention, isotropy of magnetic field detection is improved.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
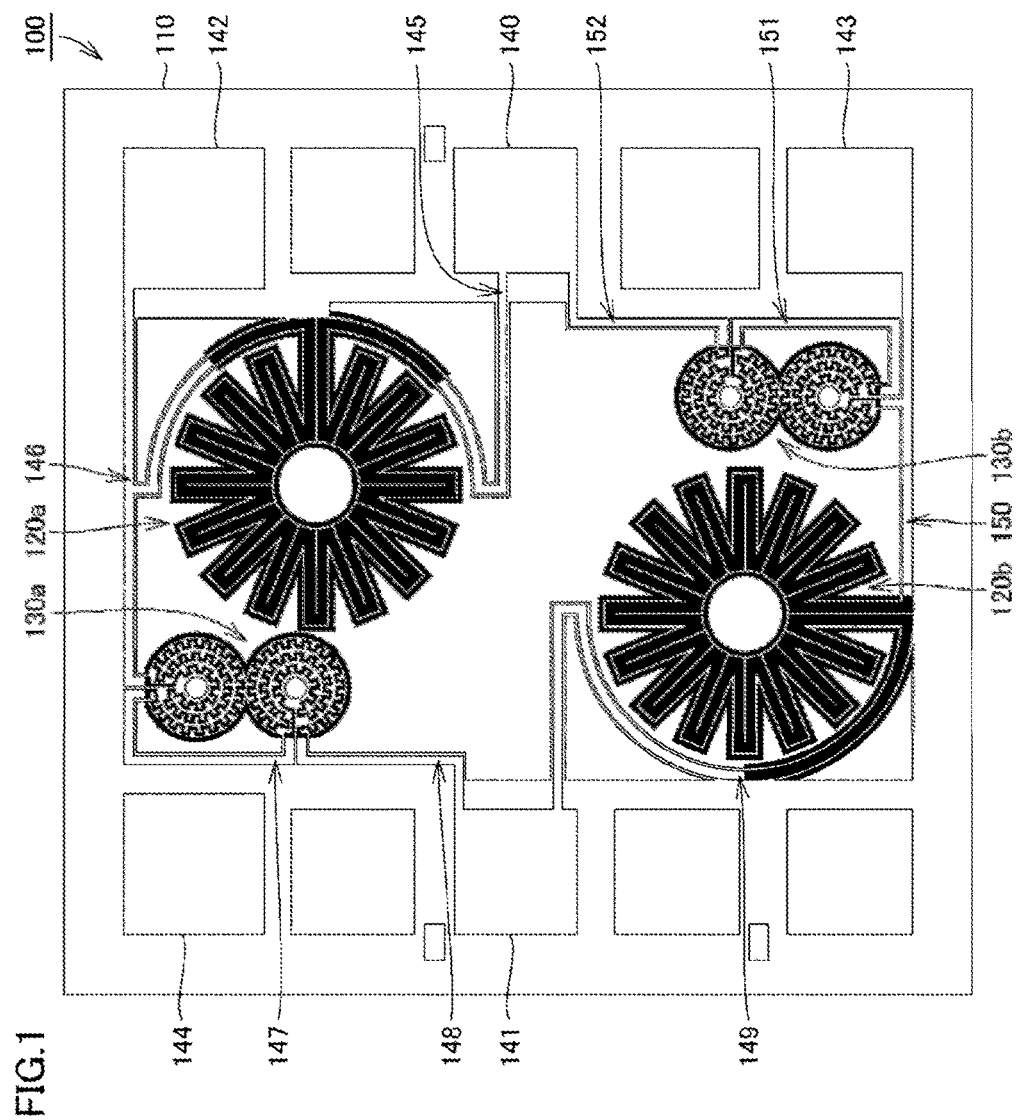
FIG. 1 is a plan view illustrating the patterns of four magnetoresistive elements that define a bridge circuit of a magnetic sensor according to preferred embodiment 1 of the present invention.

Hereafter, magnetic sensors according to preferred embodiments of the present invention will be described while referring to the drawings. In the following description of the preferred embodiments of the present invention, identical or equivalent elements or features in the drawings are denoted by the same symbols and repeated description thereof is omitted.

Preferred Embodiment 1

Figure 2:
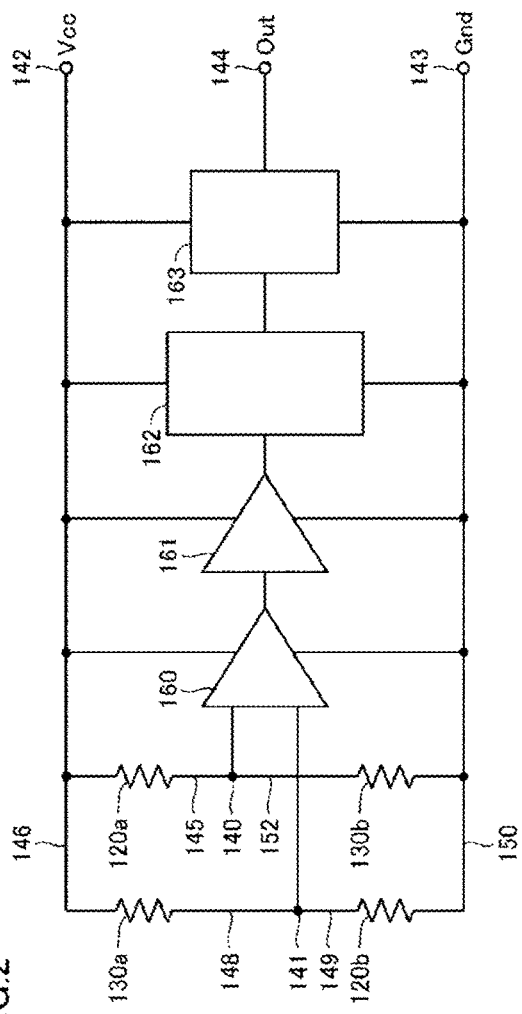
FIG. 2 is an equivalent circuit diagram of the magnetic sensor according to preferred embodiment 1 of the present invention.

FIG. 1 is a plan view illustrating the patterns of four magnetoresistive elements that define a bridge circuit of a magnetic sensor according to preferred embodiment 1 of the present invention. FIG. 2 is an equivalent circuit diagram of the magnetic sensor according to preferred embodiment 1 of the present invention.

As illustrated in FIGS. 1 and 2, a magnetic sensor 100 according to preferred embodiment 1 of the present invention includes four magnetoresistive elements that are electrically connected to each other and define a Wheatstone-bridge circuit. The four magnetoresistive elements include two first magnetoresistive elements 120a and 120b and two second magnetoresistive elements 130a and 130b.

The rates of change of resistance of the two first magnetoresistive elements 120a and 120b are higher than the rates of change of resistance of the two second magnetoresistive elements 130a and 130b. The two first magnetoresistive elements 120a and 120b are so-called magneto-sensitive resistors having electrical resistance values that change with the application of an external magnetic field. The two second magnetoresistive elements 130a and 130b are fixed resistors having electrical resistance values that substantially do not change even when an external magnetic field is applied.

The four magnetoresistive elements are electrically connected to each other by wiring lines provided on a substrate 110. Specifically, the first magnetoresistive element 120a and the second magnetoresistive element 130a are connected in series with each other by a wiring line 146. The first magnetoresistive element 120b and the second magnetoresistive element 130b are connected in series with each other by a wiring line 150.

The magnetic sensor 100 further includes a center point 140, a center point 141, a power supply terminal (Vcc) 142, a ground terminal (Gnd) 143 and an output terminal (Out) 144 provided on the substrate 110.

The first magnetoresistive element 120a and the second magnetoresistive element 130b are connected to the center point 140. Specifically, the first magnetoresistive element 120a and the center point 140 are connected to each other by a wiring line 145 and the second magnetoresistive element 130b and the center point 140 are connected to each other by a wiring line 152.

The first magnetoresistive element 120b and the second magnetoresistive element 130a are connected to the center point 141. Specifically, the first magnetoresistive element 120b and the center point 141 are connected to each other by a wiring line 149 and the second magnetoresistive element 130a and the center point 141 are connected to each other by a wiring line 148.

The wiring line 146 is connected to the power supply terminal (Vcc) 142 to which a current is input. The wiring line 150 is connected to the ground terminal (Gnd) 143.

As illustrated in FIG. 2, the magnetic sensor 100 further includes a differential amplifier 160, a temperature compensation circuit 161, a latch and switch circuit 162 and a complementary metal oxide semiconductor (CMOS) driver 163.

Input terminals of the differential amplifier 160 are connected to the center point 140 and the center point 141, and an output terminal of the differential amplifier 160 is connected to the temperature compensation circuit 161. In addition, the differential amplifier 160 is connected to the power supply terminal (Vcc) 142 and the ground terminal (Gnd) 143.

An output terminal of the temperature compensation circuit 161 is connected to the latch and switch circuit 162. In addition, the temperature compensation circuit 161 is connected to the power supply terminal (Vcc) 142 and the ground terminal (Gnd) 143.

An output terminal of the latch and switch circuit 162 is connected to the CMOS driver 163. In addition, the latch and switch circuit 162 is connected to the power supply terminal (Vcc) 142 and the ground terminal (Gnd) 143.

An output terminal of the CMOS driver 163 is connected to the output terminal (Out) 144. Furthermore, the CMOS driver 163 is connected to the power supply terminal (Vcc) 142 and the ground terminal (Gnd) 143.

As a result of the magnetic sensor 100 having the above-described circuit configuration, a potential difference, which depends on the strength of an external magnetic field, is generated between the center point 140 and the center point 141. When this potential difference exceeds a preset detection level, a signal is output from the output terminal (Out) 144.

Figure 3:
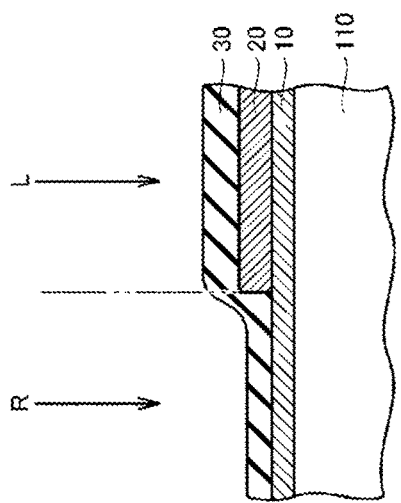
FIG. 3 is a sectional view illustrating the multilayer structure of a connection portion between a magnetoresistive element and a wiring line in the bridge circuit of the magnetic sensor according to preferred embodiment 1 of the present invention.

FIG. 3 is a sectional view illustrating the multilayer structure of a connection portion between a magnetoresistive element and a wiring line in the bridge circuit of the magnetic sensor according to preferred embodiment 1 of the present invention. FIG. 3 illustrates only a connection portion between a region R, which defines and functions as a magnetoresistive element, and a region L, which defines and functions as a wiring line.

As illustrated in FIG. 3, the four magnetoresistive elements are provided on the substrate 110 that includes a $SiO_2$ layer or a $Si_3N_4$ layer provided on a surface thereof and that includes Si or the like. The four magnetoresistive elements are formed preferably by patterning a magnetic layer 10 provided on the substrate 110 and includes an alloy including Ni or Fe by performing ion milling or the like.

A wiring line is formed preferably by patterning a conductive layer 20, which is provided on the substrate 110 and is composed of Au, Al or the like, preferably by performing wet etching. The conductive layer 20 is located directly above the magnetic layer 10 in the region where the magnetic layer 10 is provided and is located directly above the substrate 110 in the region where the magnetic layer 10 is not provided. Therefore, as illustrated in FIG. 3, the conductive layer 20 is located directly above the magnetic layer 10 in the connection portion between the region R defining and functioning as the magnetoresistive element and the region L defining and functioning as the wiring line.

The center point 140, the center point 141, the power supply terminal (Vcc) 142, the ground terminal (Gnd) 143 and the output terminal (Out) 144 are defined by the conductive layer 20 located directly above the substrate 110.

A Ti layer, which is not illustrated, is provided directly above the conductive layer 20. A protective layer 30, which is composed of $SiO_2$ or the like, covers the magnetoresistive element and the wiring line.

Figure 4:
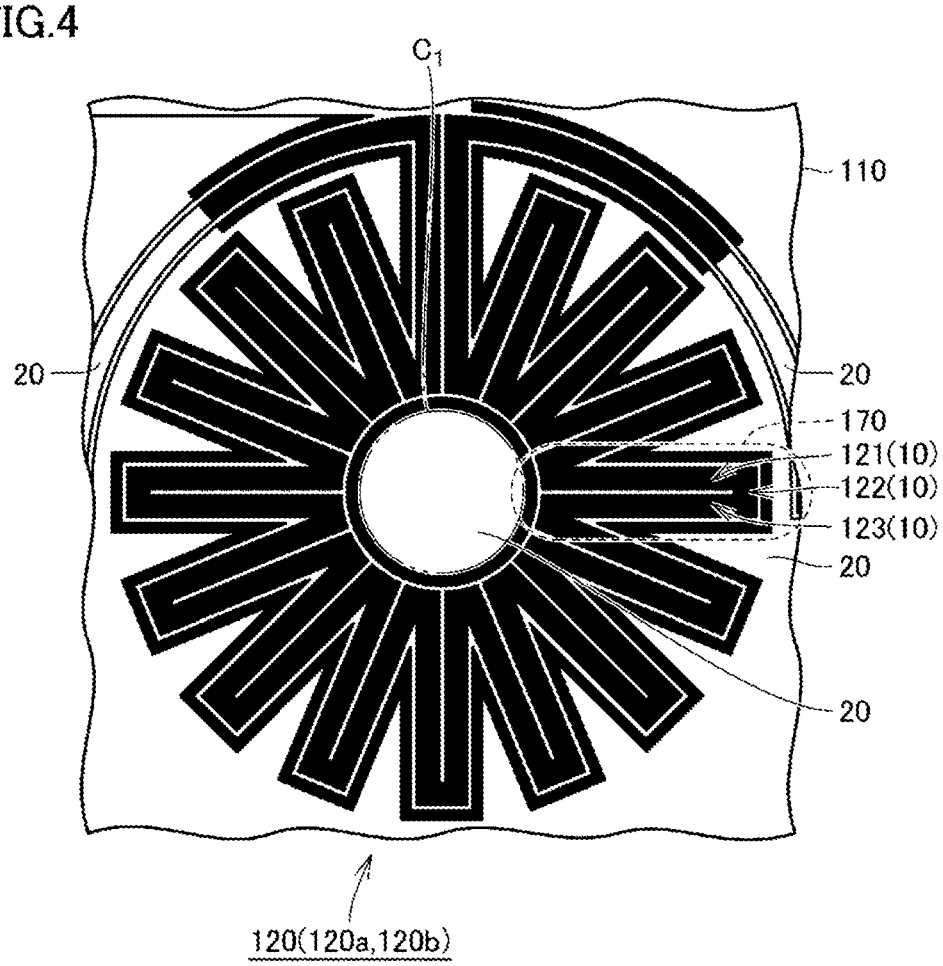
FIG. 4 is a plan view illustrating the pattern of a first magnetoresistive element of the magnetic sensor according to preferred embodiment 1 of the present invention.

FIG. 4 is a plan view illustrating the pattern of a first magnetoresistive element of the magnetic sensor according to an example of preferred embodiment 1 of the present invention. As illustrated in FIGS. 1 and 4, a pattern 120 of each of the two first magnetoresistive elements 120a and 120b preferably includes fifteen folded back patterns 170 that are arranged in a radiating manner from the center of an imaginary circle $C_1$ in plan view and are connected to each other. The fifteen folded back patterns 170 are arranged along the circumference of the imaginary circle $C_1$ outside of the imaginary circle $C_1$ so as to be arrayed in the circumferential direction of the imaginary circle $C_1$ and are connected to each other on the imaginary circle $C_1$ side.

Each of the fifteen folded back patterns 170 includes a first linear extending portion 121 and a third linear extending portion 123, which extend parallel or substantially parallel to each other in a radial direction of the imaginary circle $C_1$ with a space therebetween, and a second linear extending portion 122, which connects a leading end of the first linear extending portion 121 and a leading end of the third linear extending portion 123 to each other. The second linear extending portion 122 is perpendicular or substantially perpendicular to both the first linear extending portion 121 and the third linear extending portion 123.

As illustrated in FIG. 4, the pattern 120 is point symmetrical or substantially point symmetrical with respect to the center of the imaginary circle $C_1$. That is, the pattern 120 is positioned so as to have 180° or substantially 180° rotational symmetry with respect to the center of the imaginary circle $C_1$.

As illustrated in FIG. 1, the patterns 120 of the two first magnetoresistive elements 120a and 120b have different orientations in the circumferential directions of the imaginary circles $C_1$. In this preferred embodiment, the orientations of the patterns 120 of the two first magnetoresistive elements 120a and 120b in the circumferential directions of the imaginary circles $C_1$ differ by 90° or about 90°.

Figure 5:
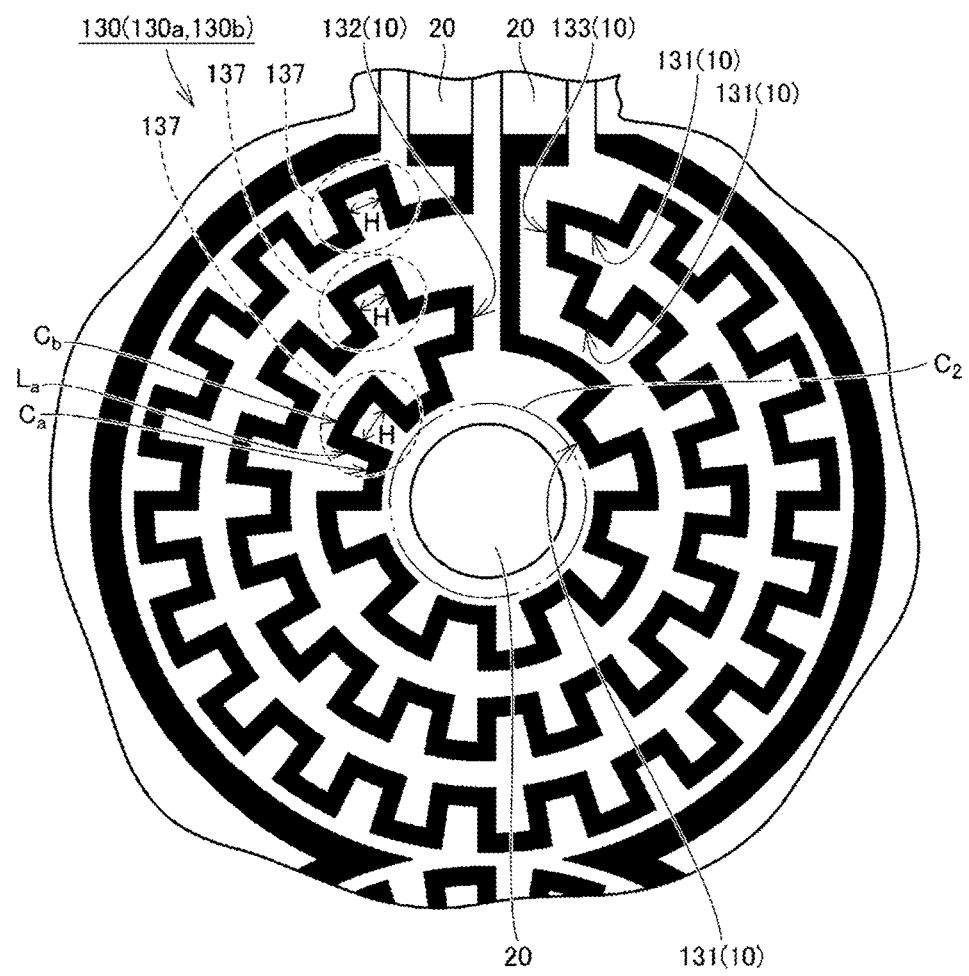
FIG. 5 is a plan view illustrating the pattern of a second magnetoresistive element of the magnetic sensor according to preferred embodiment 1 of the present invention.

FIG. 5 is a plan view illustrating the pattern of a second magnetoresistive element of the magnetic sensor according to preferred embodiment 1 of the present invention. In FIG. 5, only one of the two patterns 130, which have identical or substantially identical shapes, of each of the two second magnetoresistive elements 130a and 130b is illustrated.

As illustrated in FIGS. 1 and 5, the two patterns 130, which have identical or substantially identical shapes, of the two second magnetoresistive elements 130a and 130b are connected in series with each other. The two patterns 130, which have identical or substantially identical shapes, are connected to each other with a wiring line 147 in the second magnetoresistive element 130a. The two patterns 130, which have identical or substantially identical shapes, are connected to each other with a wiring line 151 in the second magnetoresistive element 130b. Thus, the required electrical resistance value is secured in each of the two second magnetoresistive elements 130a and 130b. The higher the electrical resistance values of the two second magnetoresistive elements 130a and 130b are, the more the current consumption of the magnetic sensor 100 is able to be reduced.

The two patterns 130 are each arranged along an imaginary circle $C_2$ in plan view and each include a plurality of unit patterns 137, which each include four bent portions and a folded back shape. The plurality of unit patterns 137 are connected to each other in a direction that encloses a region around the center of the imaginary circle $C_2$.

In plan view, each of the plurality of unit patterns 137 is defined by three arc-shaped portions $C_a$ and $C_b$, which are respectively located on two concentric circles that are concentric with the imaginary circle $C_2$, and two linear extending portions $L_a$, which extend in a radiating manner from the center of the imaginary circle $C_2$ and connect every two arc-shaped portions $C_a$ and $C_b$, which are adjacent to each other in a radial direction of the imaginary circle $C_2$, to each other. Specifically, one linear extending portion $L_a$ connects one of the arc-shaped portion $C_a$ and one end of the arc-shaped portion $C_b$ to each other and the other linear extending portion $L_a$ connects the other arc-shaped portion $C_a$ and the other end of the arc-shaped portion $C_b$ to each other. A maximum spacing H between any two linear extending portions $L_a$ is the same or substantially the same throughout all of the plurality of unit patterns 137.

In this preferred embodiment, the plurality of unit patterns 137 project toward the outside from arc-shaped portions 131 ($C_a$) of three concentric circles that are concentric with the imaginary circle $C_2$ in plan view. Six unit patterns 137 project from the arc-shaped portions 131 ($C_a$) of the concentric circle that is positioned innermost. Thirteen unit patterns 137 project from the arc-shaped portions 131 ($C_a$) of the concentric circle that is positioned in the middle. Eighteen unit patterns 137 project from the arc-shaped portions 131 ($C_a$) of the concentric circle that is positioned outermost.

The six unit patterns 137 that are positioned innermost and the 13 unit patterns 137 are positioned in the middle are connected to each other by a connection portion 132. The thirteen unit patterns 137 that are positioned in the middle and the eighteen unit patterns 137 that are positioned outermost are connected to each other by a connection portion 133. Thus, the thirty-seven unit patterns 137 are connected to each other so as to enclose a region around the center of the imaginary circle $C_2$ in three layers. The positions of the thirty-seven unit patterns 137 along the circumferential direction of the imaginary circle $C_2$ are shifted from one another.

In this preferred embodiment, each of the thirty-seven unit patterns 137 preferably is bent in four bent portions, for example. The thirty-seven unit patterns 137 do not include any linear extending portions with a length of about 10 μm or more.

The electrical resistance value of a magnetoresistive element changes due to the magnetoresistive effect when a magnetic field is applied at a specific angle with respect to the direction in which a current flows through the magnetoresistive element. The magnetoresistive effect becomes stronger as the length of a magnetoresistive element in the longitudinal direction thereof increases.

Therefore, as a result of the two second magnetoresistive elements 130a and 130b having the above-described patterns, the magnetoresistive effects of the two second magnetoresistive elements 130a and 130b are significantly reduced or prevented and the rates of change of resistance of the second magnetoresistive elements 130a and 130b are very low. As a result, the rates of change of resistance of the two first magnetoresistive elements 120a and 120b are higher than the rates of change of resistance of the two second magnetoresistive elements 130a and 130b.

In the magnetic sensor 100 according to this preferred embodiment, the orientations of the patterns 120 of the two first magnetoresistive elements 120a and 120b in the circumferential directions of the imaginary circles $C_1$ differ by 90° or about 90° and therefore the isotropy of magnetic field detection is improved.

In the magnetic sensor 100 according to this preferred embodiment, the two second magnetoresistive elements 130a and 130b each include thirty-seven unit patterns 137, which do not include any linear extending portions having a length of about 10 μm or more and are folded back by being bent in four bent portions.

Thus, the anisotropy of the magnetoresistive effects of the two second magnetoresistive elements 130a and 130b is able to be reduced by causing the direction of a current flowing through the thirty-seven unit patterns 137 to vary across the horizontal directions. The horizontal directions are directions that are parallel or substantially parallel to the surface of the substrate 110. In addition, variations in the output of the magnetic sensor 100 that occur when the external magnetic field is zero are able to be significantly reduced or prevented, the variations being caused by the effect of residual magnetization.

In addition, the anisotropy of the magnetoresistive effects of the two second magnetoresistive elements 130a and 130b is able to be significantly reduced by causing the direction of the current that flows through the pattern 130 to vary across the horizontal directions by arranging the thirty-seven unit patterns 137 along the circumference of the imaginary circle $C_2$.

In addition, the orientations of the thirty-seven unit patterns 137 relative to the center of the imaginary circle $C_2$ are shifted from one another, and therefore the anisotropy of the magnetoresistive effect of the two second magnetoresistive elements 130a and 130b is able to be significantly reduced by causing the direction of the current that flows through the pattern 130 to vary across the horizontal directions to a greater degree.

Hereafter, a magnetic sensor according to preferred embodiment 2 of the present invention will be described while referring to the drawings. The magnetic sensor according to this preferred embodiment differs from the magnetic sensor 100 according to preferred embodiment 1 only in terms of the pattern of the second magnetoresistive elements and therefore repeated description of the rest of the configuration will be omitted.

Preferred Embodiment 2

Figure 6:
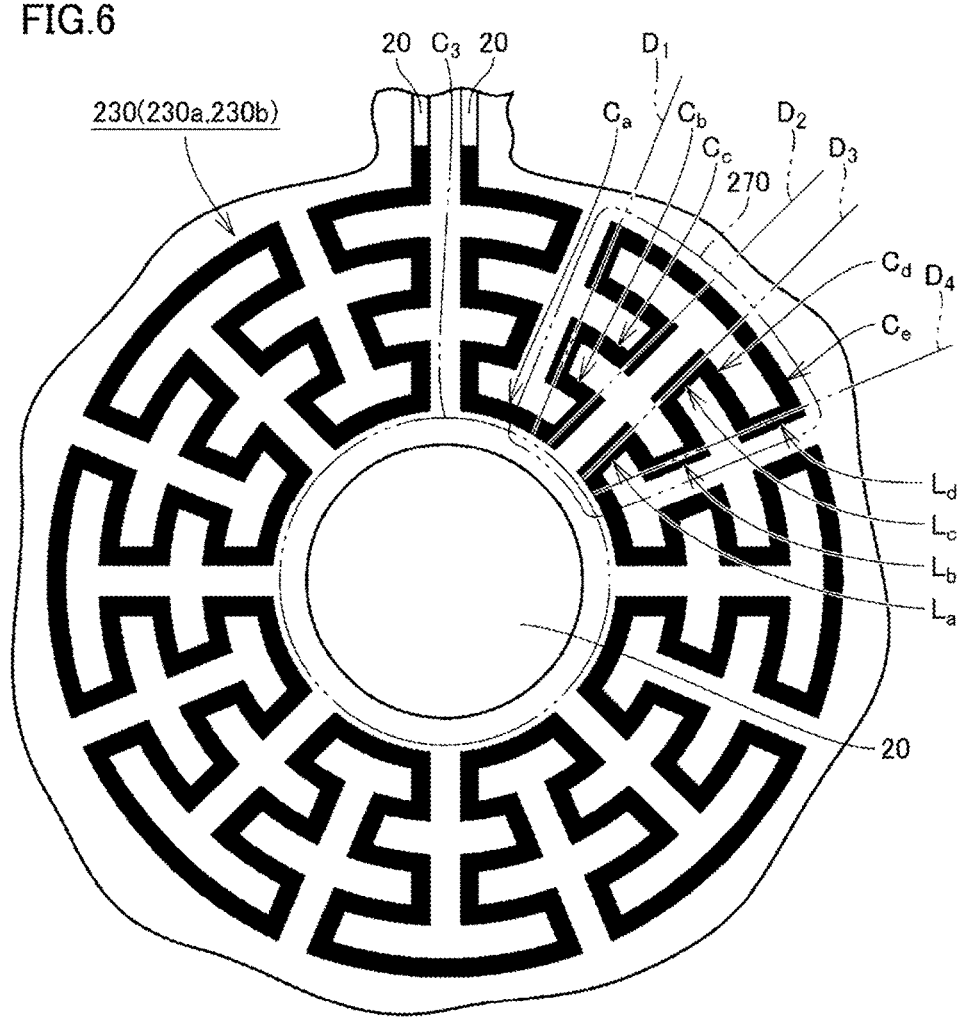
FIG. 6 is a plan view illustrating the pattern of a second magnetoresistive element of a magnetic sensor according to preferred embodiment 2 of the present invention.

FIG. 6 is a plan view illustrating the pattern of a second magnetoresistive element of the magnetic sensor according to preferred embodiment 2 of the present invention. In FIG. 6, only one of two patterns 230, which have identical or substantially identical shapes, of each of the two second magnetoresistive elements is illustrated.

The two second magnetoresistive elements 230a and 230b of the magnetic sensor according to preferred embodiment 2 of the present invention each include two patterns 230, which have identical or substantially identical shapes, connected in series with each other.

As illustrated in FIG. 6, the two patterns 230 each include seven unit patterns 270 that are arranged along an imaginary circle $C_3$ in plan view, the unit patterns 270 each including sixteen bent portions and a folded back shape. The seven unit patterns 137 are connected to each other in a direction that encloses a region around the center of the imaginary circle $C_3$.

In plan view, each of the seven unit patterns 270 is defined by nine arc-shaped portions $C_a$ to $C_e$, which are respectively positioned on five concentric circles that are concentric with the imaginary circle $C_3$, and eight linear extending portions $L_a$ to $L_d$, which extend in a radiating manner from the center of the imaginary circle $C_3$ and connect every two arc-shaped portions, which are adjacent to each other in a radial direction of the imaginary circle $C_3$, to each other.

Specifically, one linear extending portion $L_a$ connects one arc-shaped portion $C_a$ and one arc-shaped portion $C_b$ to each other and another linear extending portion $L_a$ connects another arc-shaped portion $C_a$ and another arc-shaped portion $C_b$ to each other. One linear extending portion $L_b$ connects one arc-shaped portion $C_b$ and one arc-shaped portion $C_c$ to each other and another linear extending portion $L_b$ connects another arc-shaped portion $C_b$ and another arc-shaped portion $C_c$ to each other. One linear extending portion $L_c$ connects one arc-shaped portion $C_c$ and one arc-shaped portion $C_d$ to each other and another linear extending portion $L_c$ connects another arc-shaped portion $C_c$ and another arc-shaped portion $C_d$ to each other. One linear extending portion $L_d$ connects one arc-shaped portion $C_d$ and one end of the arc-shaped portion $C_e$ to each other and another linear extending portion $L_d$ connects another arc-shaped portion $C_d$ and the other end of the arc-shaped portion $C_e$ to each other.

The one linear extending portion $L_a$ and the one linear extending portion $L_c$ are positioned on the same straight line $D_2$. The one linear extending portion $L_b$ and the one linear extending portion $L_d$ are positioned on the same straight line $D_1$. The other linear extending portion $L_a$ and the other linear extending portion $L_c$ are positioned on the same straight line $D_3$. The other linear extending portion $L_b$ and the other linear extending portion $L_d$ are positioned on the same straight line $D_4$.

Thus, in this preferred embodiment, the seven unit patterns 270 are each bent at the sixteen bent portions and folding back angles that are adjacent to each other on the inner side with respect to the imaginary circle $C_3$ and folding back angles that are adjacent to each other on the outer side with respect to the imaginary circle $C_3$ are the same as each other. The seven unit patterns 270 are arranged along the imaginary circle $C_3$ and connected to each other.

As a result of the folding back angles that are adjacent to each other on the inner side with respect to the imaginary circle $C_3$ and the folding back angles that are adjacent to each other on the outer side with respect to the imaginary circle $C_3$ being the same as each other in the unit patterns 270 of the second magnetoresistive elements, the symmetry of the pattern 230 is improved in the magnetic sensor according to preferred embodiment 2 of the present invention. Consequently, the anisotropy of the magnetoresistive effects of the second magnetoresistive elements is able to be reduced by causing the direction of a current that flows through the pattern 230 to be more uniform across the horizontal directions.

Hereafter, a magnetic sensor according to preferred embodiment 3 of the present invention will be described while referring to the drawings. The magnetic sensor according to this preferred embodiment differs from the magnetic sensor 100 according to preferred embodiment 1 only in terms of the pattern of the second magnetoresistive elements and therefore repeated description of the rest of the configuration will be omitted.

Preferred Embodiment 3

Figure 7:
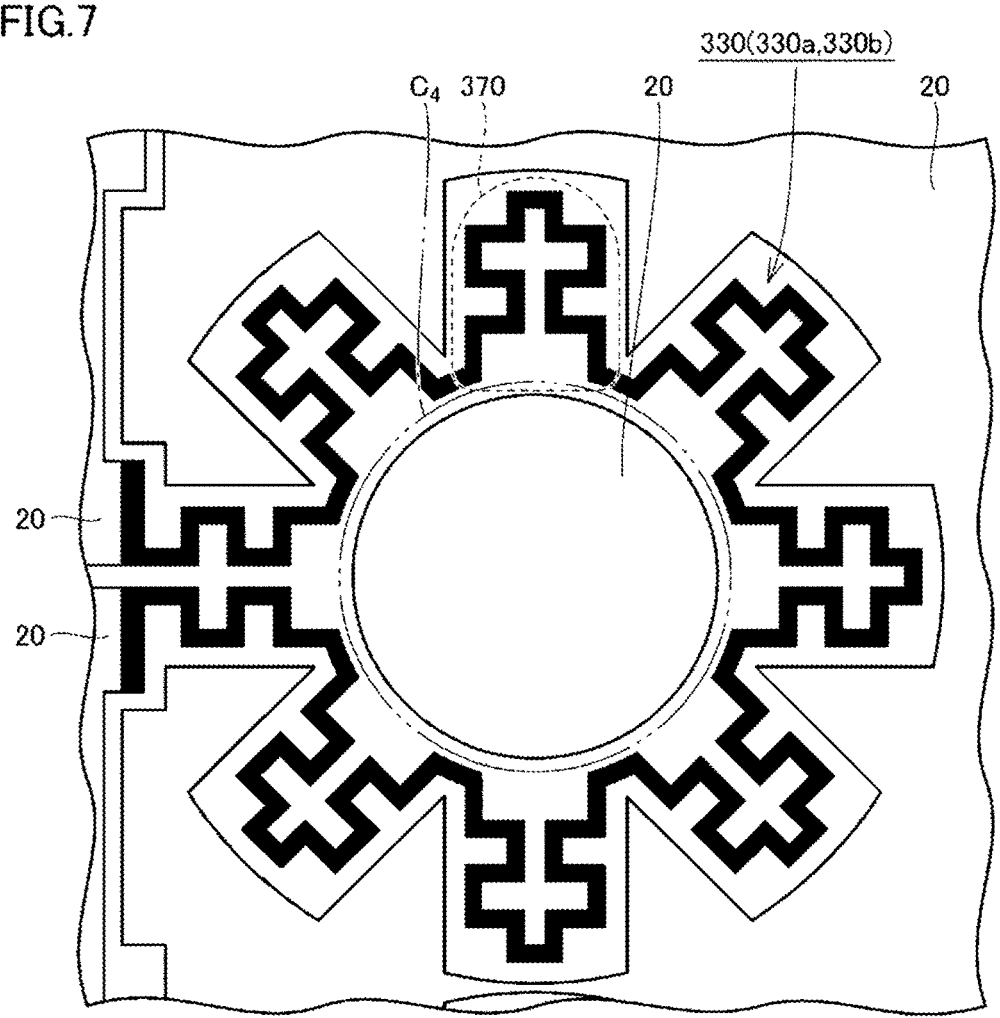
FIG. 7 is a plan view illustrating the pattern of a second magnetoresistive element of a magnetic sensor according to preferred embodiment 3 of the present invention.
Figure 8:
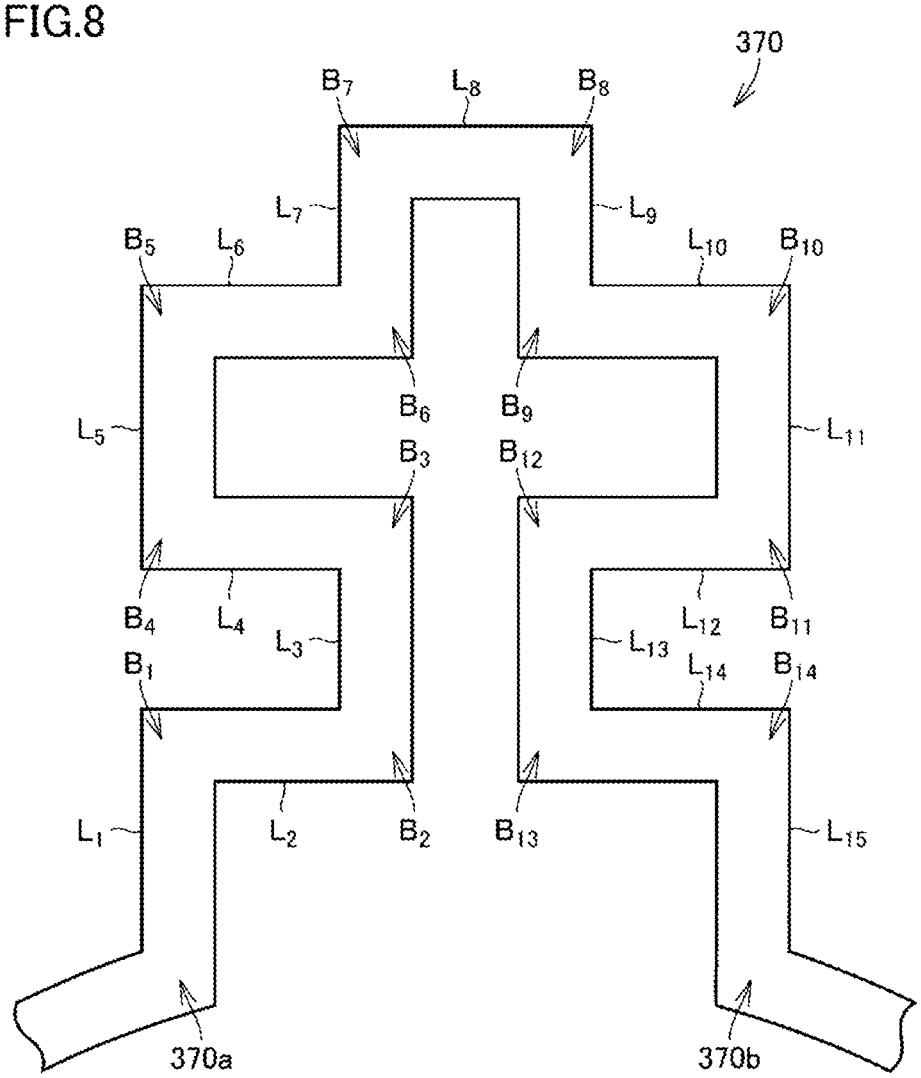
FIG. 8 is a plan view illustrating a unit pattern included in the pattern of the second magnetoresistive element of the magnetic sensor according to preferred embodiment 3 of the present invention.

FIG. 7 is a plan view illustrating the pattern of a second magnetoresistive element of the magnetic sensor according to preferred embodiment 3 of the present invention. FIG. 8 is a plan view illustrating a unit pattern included in the pattern of the second magnetoresistive element of the magnetic sensor according to preferred embodiment 3 of the present invention. In FIG. 7, only one of two patterns 330, which have identical shapes, of each of the two second magnetoresistive elements is illustrated.

The two second magnetoresistive elements 330a and 330b each includes two patterns 330, which have identical or substantially identical shapes, that each include eight unit patterns 370 that include a plurality of bent portions and have a folded back shape.

As illustrated in FIG. 7, the eight unit patterns 370 are arranged along an imaginary circle $C_4$ and connected to each other. The eight unit patterns 370 are connected to each other in a direction that encloses a region around the center of the imaginary circle $C_4$. As illustrated in FIG. 8, each unit pattern 370 is folded back on itself in a region between a start end portion 370a and a finish end portion 370b and includes fourteen bent portions $B_1$ to $B_{14}$ and fifteen linear extending portions $L_1$ to $L_{15}$. In other words, the unit pattern 370 preferably has a bag shape with the start end portion 370a and the finish end portion 370b being opening portions.

In this preferred embodiment, the unit pattern 370 is bent at right angles in each of the fourteen bent portions $B_1$ to $B_{14}$. The second unit pattern 370 does not include any linear extending portions with a length of about 10 µm or more, for example. In other words, the lengths of all fifteen linear extending portions $L_1$ to $L_{15}$ are smaller than about 10 µm, for example. In the magnetic sensor according to this preferred embodiment, the two second magnetoresistive elements 330a and 330b each include unit patterns 370 preferably having a bag shape that does not include any linear extending portions having a length of about 10 µm or more, that is bent at right angles in fourteen bent portions $B_1$ to $B_{14}$ and in which the start end portion 370a and the finish end portion 370b are openings, for example.

Thus, the anisotropy of the magnetoresistive effects of the two second magnetoresistive elements 330a and 330b is able to be reduced by causing the direction of a current flowing through the unit patterns 370 to vary across the horizontal directions. In addition, variations in the output of the magnetic sensor that occur when the external magnetic field is zero are able to be significantly reduced or prevented, the variations being caused by the effect of residual magnetization.

In addition, the anisotropy of the magnetoresistive effects of the two second magnetoresistive elements 330a and 330b is able to be reduced by causing the direction of the current that flows through the pattern 330 to vary across the horizontal directions by arranging the plurality of unit patterns 370 along the circumference of the imaginary circle $C_4$.

The number of unit patterns 370 of the two second magnetoresistive elements 330a and 330b is not limited to the number described above. Hereafter, description will be given of a magnetic sensor according to preferred embodiment 4 of the present invention that differs from the magnetic sensor according to preferred embodiment 3 only in terms of a unit pattern of the second magnetoresistive elements. Repeated description of the elements of the configuration other than the unit pattern of the second magnetoresistive elements is omitted in the following description.

Preferred Embodiment 4

Figure 9:
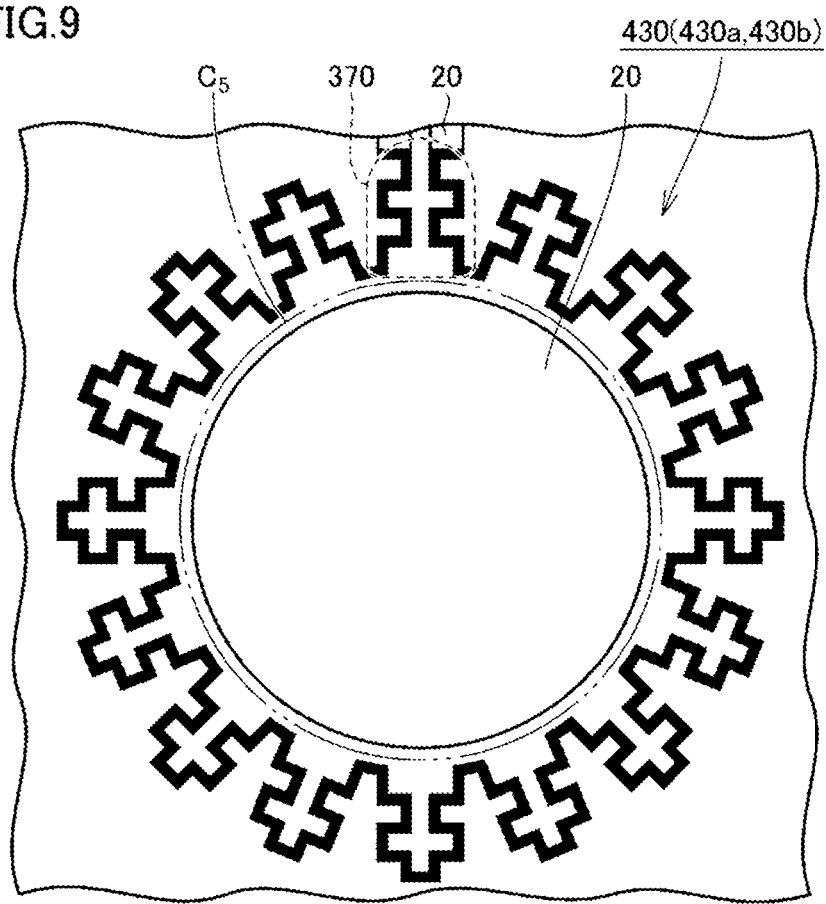
FIG. 9 is a plan view illustrating the pattern of a second magnetoresistive element of a magnetic sensor according to preferred embodiment 4 of the present invention.

FIG. 9 is a plan view illustrating the pattern of a second magnetoresistive element of the magnetic sensor according to preferred embodiment 4 of the present invention. In FIG. 9, only one of two patterns 430, which have identical or substantially identical shapes, of each of the two second magnetoresistive elements is illustrated.

The two second magnetoresistive elements 430a and 430b each include two patterns 430, which have identical or substantially identical shapes, that each include sixteen unit patterns 370 that include a plurality of bent portions and have a folded back shape.

As illustrated in FIG. 9, the sixteen unit patterns 370 are arranged along an imaginary circle $C_5$ and connected to each other. The sixteen unit patterns 370 are connected to each other in a direction that encloses a region around the center of the imaginary circle $C_5$. Since the two second magnetoresistive elements 430a and 430b of the magnetic sensor according to this preferred embodiment include a larger number of identically shaped unit patterns 370 than the two second magnetoresistive elements 330a and 330b of the magnetic sensor according to preferred embodiment 3, the anisotropy of the magnetoresistive effect is able to be reduced by a larger amount compared with the two second magnetoresistive elements 330a and 330b of the magnetic sensor according to preferred embodiment 3 by causing the directions of the currents that flow through the patterns 430 to vary across the horizontal directions to a greater degree.

Hereafter, a magnetic sensor according to preferred embodiment 5 of the present invention will be described while referring to the drawings. The magnetic sensor according to this preferred embodiment differs from the magnetic sensor 100 according to preferred embodiment 1 only in terms of the pattern of the second magnetoresistive elements and therefore repeated description of the rest of the configuration will be omitted.

Preferred Embodiment 5

Figure 10:
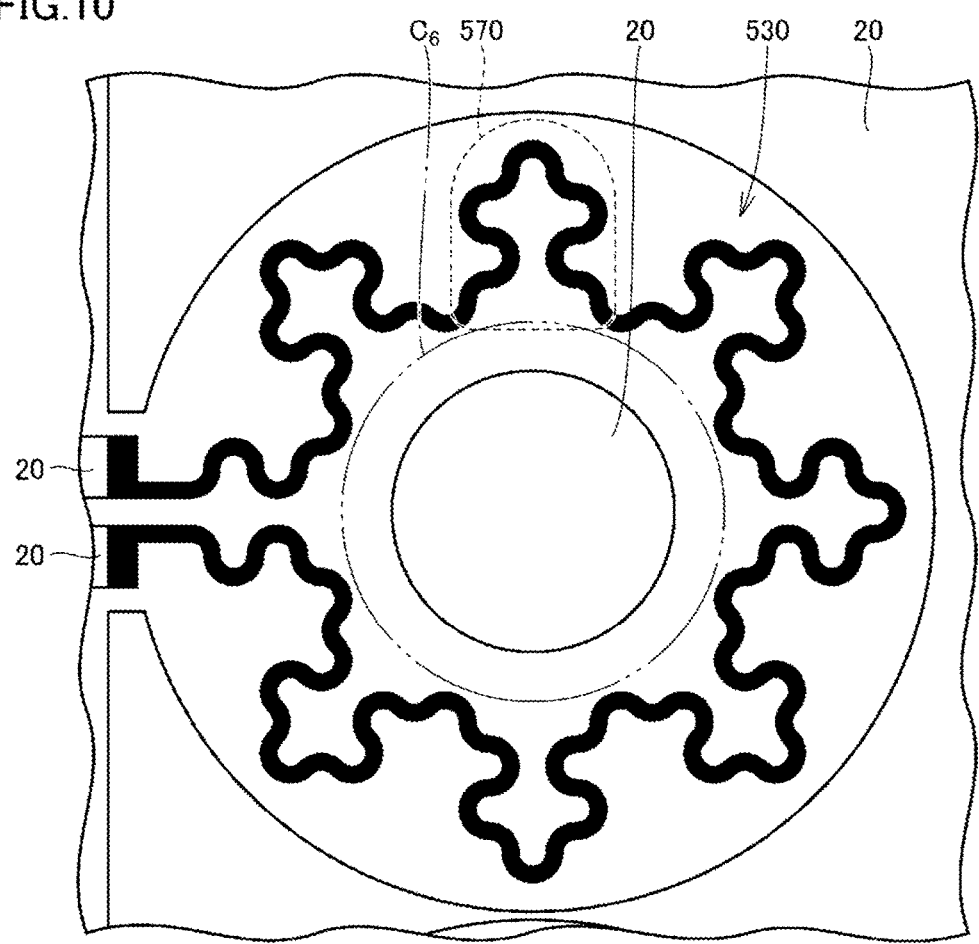
FIG. 10 is a plan view illustrating the pattern of a second magnetoresistive element of a magnetic sensor according to preferred embodiment 5 of the present invention.
Figure 11:
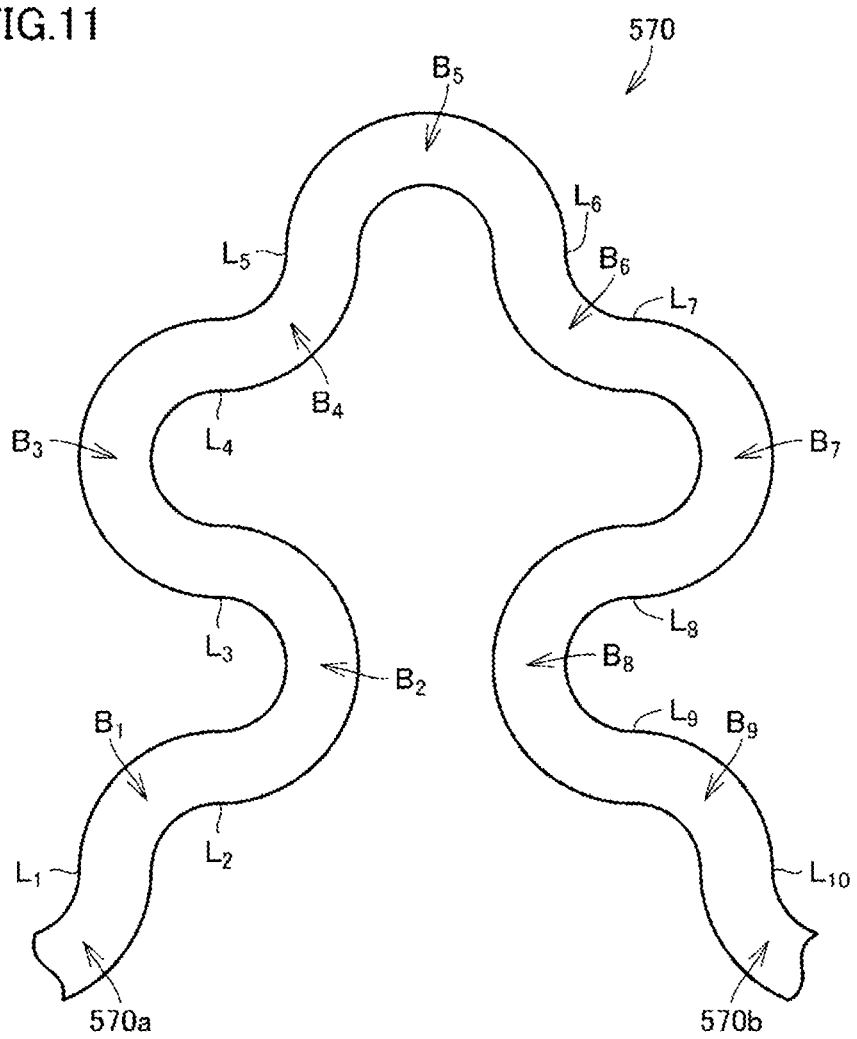
FIG. 11 is a plan view illustrating a unit pattern included in the pattern of the second magnetoresistive element of the magnetic sensor according to preferred embodiment 5 of the present invention.

FIG. 10 is a plan view illustrating the pattern of a second magnetoresistive element of the magnetic sensor according to preferred embodiment 5 of the present invention. FIG. 11 is a plan view illustrating a unit pattern included in the pattern of the second magnetoresistive element of the magnetic sensor according to preferred embodiment 5 of the present invention.

The two second magnetoresistive elements of the magnetic sensor according to preferred embodiment 5 of the present invention each include eight unit patterns 570 that each include a plurality of bent portions and have a folded back shape.

As illustrated in FIG. 10, the eight unit patterns 570 are arranged along an imaginary circle $C_6$ and connected to each other. The eight unit patterns 570 are connected to each other in a direction that encloses a region around the center of the imaginary circle $C_6$. As illustrated in FIG. 11, each unit pattern 570 is folded back on itself in a region between a start end portion 570a and a finish end portion 570b and includes nine bent portions $B_1$ to $B_9$ and ten linear extending portions $L_1$ to $L_{10}$. In other words, the unit pattern 570 preferably has a bag shape with the start end portion 570a and the finish end portion 570b being defined by openings.

In this preferred embodiment, the unit pattern 570 curves in each of the nine bent portions $B_1$ to $B_9$. The unit pattern 570 does not include any linear extending portions with a length of about 10 µm or more, for example. In other words, the lengths of all ten linear extending portions $L_1$ to $L_{10}$ are smaller than about 10 µm, for example.

The bent portions of the unit pattern 570 of the second magnetoresistive elements of the magnetic sensor according to preferred embodiment 5 of the present invention are curved, and therefore, compared with the second magnetoresistive elements of the magnetic sensor according to preferred embodiment 3, the anisotropy of the magnetoresistive effects of the second magnetoresistive elements is able to be reduced by a greater amount by causing the direction of the current that flows through the unit pattern 570 to vary across the horizontal directions to a greater degree.

The number of bent portions of the unit pattern is not limited to the number described above. Hereafter, a magnetic sensor according to preferred embodiment 6 of the present invention, which differs from the magnetic sensor according to preferred embodiment 5 only in terms of the number of bent portions of the unit pattern, will be described. Repeated description of the elements of the configuration other than the unit pattern of the second magnetoresistive elements is omitted in the following description.

Preferred Embodiment 6

Figure 12:
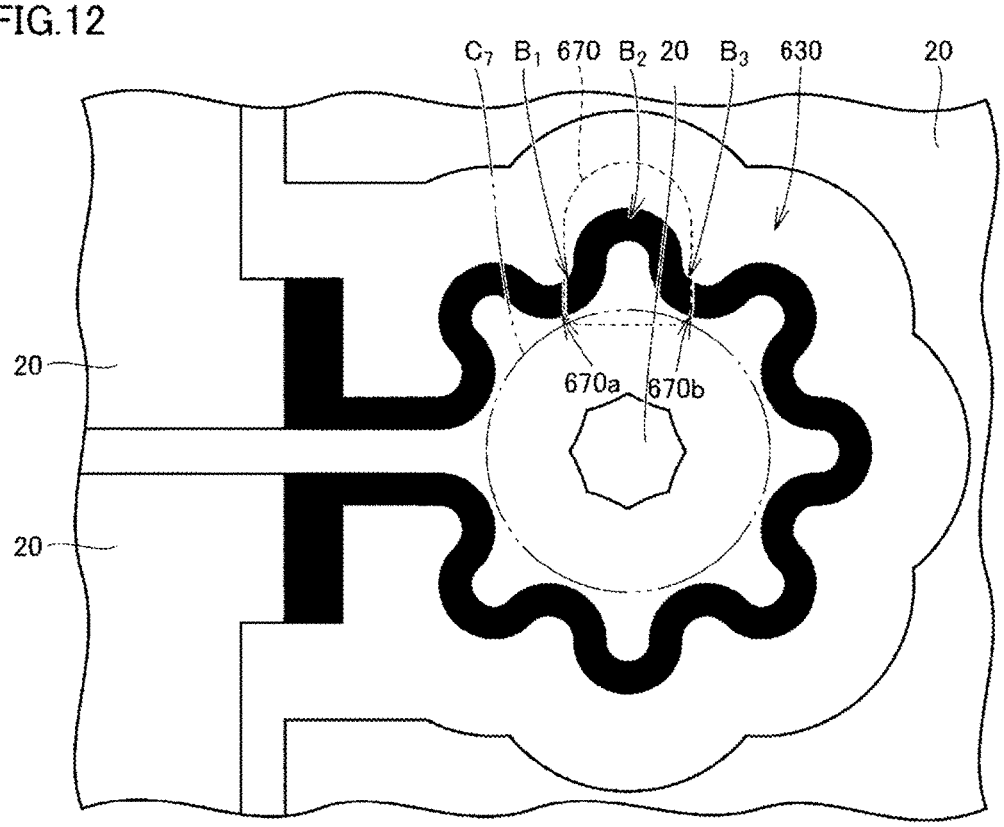
FIG. 12 is a plan view illustrating the pattern of a second magnetoresistive element of a magnetic sensor according to preferred embodiment 6 of the present invention.

FIG. 12 is a plan view illustrating the pattern of a second magnetoresistive element of the magnetic sensor according to preferred embodiment 6 of the present invention. The two second magnetoresistive elements of the magnetic sensor according to preferred embodiment 6 of the present invention each include seven unit patterns 670 that each include a plurality of bent portions and have a folded back shape.

As illustrated in FIG. 12, the seven unit patterns 670 are arranged along an imaginary circle $C_7$ and connected to each other. The seven unit patterns 670 are connected to each other in a direction that encloses a region around the center of the imaginary circle $C_7$. Each unit pattern 670 is folded back on itself in a region between a start end portion 670a and a finish end portion 670b and includes three bent portions $B_1$ to $B_3$. In other words, the unit pattern 670 preferably has a bag shape, and the start end portion 670a and the finish end portion 670b are openings.

In this preferred embodiment, the unit pattern 670 curves in each of the three bent portions $B_1$ to $B_3$. The unit pattern 670 does not include any linear extending portions.

The bent portions of the unit pattern 670 of the second magnetoresistive elements of magnetic sensor according to preferred embodiment 6 of the present invention are curved and therefore the anisotropy of the magnetoresistive effects of the second magnetoresistive elements is able to be reduced by causing the direction in which a current flows through the unit pattern 670 to vary across the horizontal directions.

Hereafter, a magnetic sensor according to preferred embodiment 7 of the present invention will be described while referring to the drawings. The magnetic sensor according to this preferred embodiment differs from the magnetic sensor 100 according to preferred embodiment 1 only in terms of the pattern of the second magnetoresistive elements and therefore repeated description of the rest of the configuration will be omitted.

Preferred Embodiment 7

Figure 13:
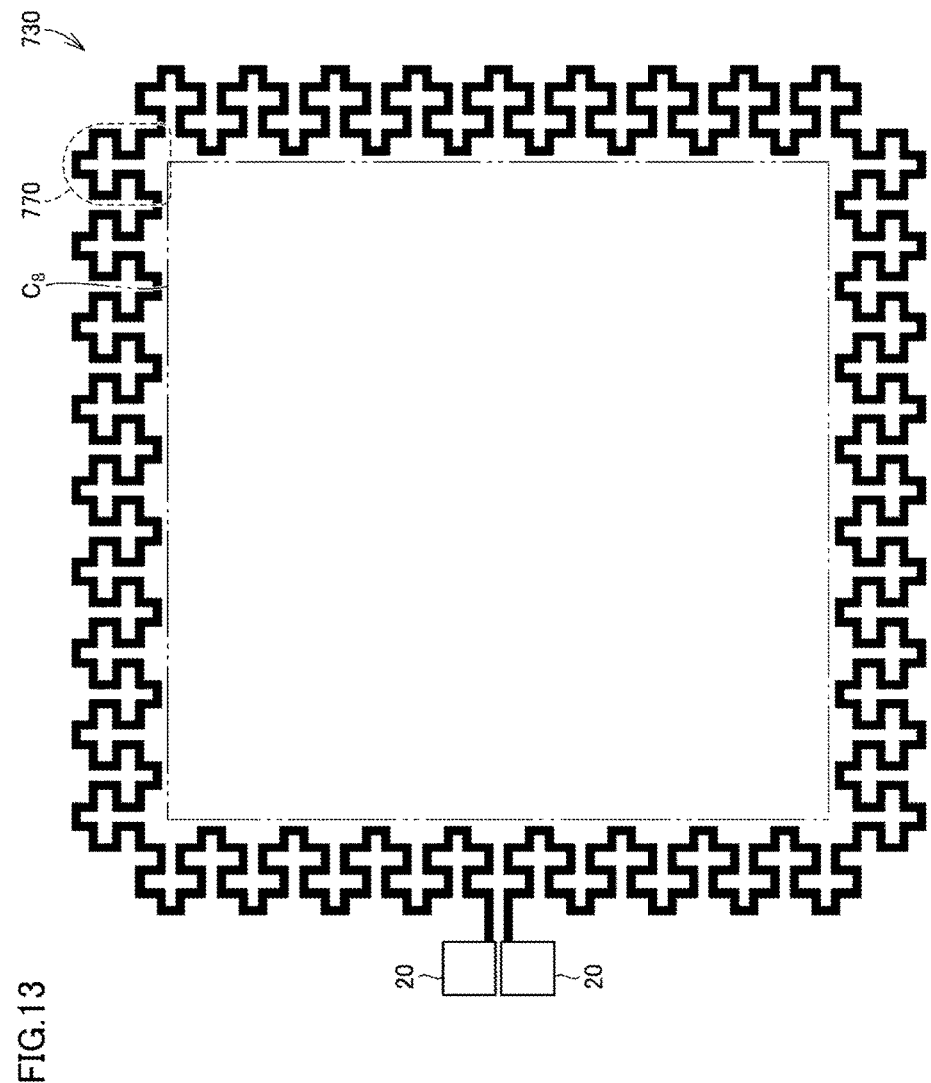
FIG. 13 is a plan view illustrating the pattern of a second magnetoresistive element of a magnetic sensor according to preferred embodiment 7 of the present invention.
Figure 14:
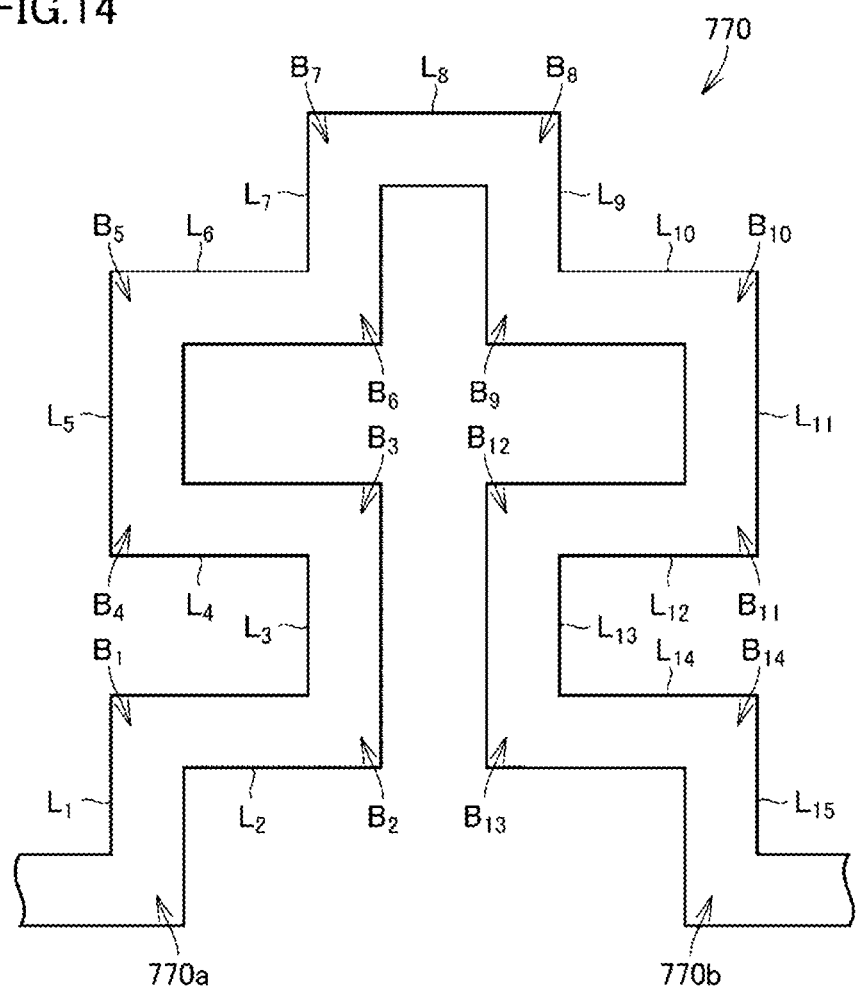
FIG. 14 is a plan view illustrating a unit pattern included in the pattern of the second magnetoresistive element of the magnetic sensor according to preferred embodiment 7 of the present invention.

FIG. 13 is a plan view illustrating the pattern of a second magnetoresistive element of the magnetic sensor according to preferred embodiment 7 of the present invention. FIG. 14 is a plan view illustrating a unit pattern included in the pattern of the second magnetoresistive element of the magnetic sensor according to preferred embodiment 7 of the present invention.

As illustrated in FIG. 13, the two second magnetoresistive elements of the magnetic sensor according to preferred embodiment 7 of the present invention each include a pattern 730 that includes thirty-two unit patterns 770 that each include a plurality of bent portions and have a folded back shape.

As illustrated in FIG. 13, the thirty-two unit patterns 770 are arranged along an imaginary rectangle $C_8$ and connected to each other. The thirty-two unit patterns 770 are connected to each other in a direction that encloses a region around the center of the imaginary rectangle $C_8$. The plurality of unit patterns 770 may instead be arranged along an imaginary polygonal shape other than an imaginary rectangle.

As illustrated in FIG. 14, each unit pattern 770 is folded back on itself in a region between a start end portion 770a and a finish end portion 770b and includes fourteen bent portions $B_1$ to $B_{14}$ and fifteen linear extending portions $L_1$ to $L_{15}$. In other words, the unit pattern 770 preferably has a bag shape, and the start end portion 770a and the finish end portion 770b are openings.

In this preferred embodiment, the unit pattern 770 is bent at right angles in each of the fourteen bent portions $B_1$ to $B_{14}$. The unit pattern 770 does not include any linear extending portions with a length of about 10 µm or more, for example. In other words, the lengths of all fifteen linear extending portions $L_1$ to $L_{15}$ are smaller than about 10 µm, for example.

The plurality of unit patterns 770 of the two second magnetoresistive elements of the magnetic sensor according to preferred embodiment 7 of the present invention are arranged along the imaginary rectangle $C_8$, and therefore the anisotropy of the magnetoresistive effect of the two second magnetoresistive elements is able to be reduced by causing the direction in which a current flows through the unit pattern 730 to vary across the horizontal directions.

The presently disclosed preferred embodiments are illustrative in all points and should not be considered as limiting. The scope of the present invention is not defined by the above description but rather by the scope of the claims and it is intended that equivalents to the scope of the claims and all modifications within the scope of the claims be included within the scope of the present invention.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A magnetic sensor comprising:
a plurality of magnetoresistive elements that are electrically connected to each other and define a bridge circuit; wherein
the plurality of magnetoresistive elements includes a first magnetoresistive element and a second magnetoresistive element;
a rate of change of resistance of the first magnetoresistive element is higher than a rate of change of resistance of the second magnetoresistive element;
the second magnetoresistive element includes a plurality of unit patterns that are arranged along an imaginary circle or an imaginary polygon in plan view and the unit patterns each include a plurality of bent portions and a folded back shape;
the plurality of unit patterns are connected to each other in a direction that encloses a region around a center of the imaginary circle or imaginary polygon; and
in plan view, the plurality of unit patterns each include a plurality of arc-shaped portions that are respectively located on a plurality of concentric circles, which are concentric with the imaginary circle, and a plurality of linear extending portions that extend in a radiating manner from the center of the imaginary circle and connect every two adjacent arc-shaped portions, which are adjacent to each other in a radial direction of the imaginary circle, to each other.

2. The magnetic sensor according to claim 1, wherein the unit patterns do not include any linear extending portions having a length of about 10 μm or more.

3. The magnetic sensor according to claim 1, wherein each of the plurality of unit patterns is bent in each of the plurality of bent portions.

4. The magnetic sensor according to claim 1, wherein each of the plurality of unit patterns is curved in each of the plurality of bent portions.

5. The magnetic sensor according to claim 1, wherein the plurality of unit patterns are connected to each other so as to enclose a region around the center of the imaginary circle in a layered manner.

6. The magnetic sensor according to claim 1, wherein the bridge circuit is a Wheatstone-bridge circuit.

7. The magnetic sensor according to claim 1, wherein a number of the plurality of magnetoresistive elements is four.

8. The magnetic sensor according to claim 1, wherein two of the plurality of magnetoresistive elements are magneto-sensitive resistors having variable resistance values and two of the plurality of magnetoresistive elements are fixed resistors.

9. The magnetic sensor according to claim 1, wherein a first two of the plurality of magnetoresistive elements are connected in series, and a second two of the plurality of magnetoresistive elements are connected in series.

10. The magnetic sensor according to claim 9, wherein a first wiring line connects the first two of the plurality of magnetoresistive elements in series and a second wiring line connects the second two of the plurality of magnetoresistive elements.

11. The magnetic sensor according to claim 1, further comprising:
a first center point;
a second center point;
a power supply terminal;
a ground terminal; and
an output terminal; wherein
each of the first center point, the second center point, the ground terminal and the output terminal are provided on the substrate.

12. The magnetic sensor according to claim 1, further comprising:
a differential amplifier;
a temperature compensation circuit;
a latch and switch circuit; and
a complementary metal oxide semiconductor driver.

13. The magnetic sensor according to claim 1, wherein the substrate includes a $SiO_2$ layer or a $Si_3N_4$ layer thereon.

14. The magnetic sensor according to claim 1, wherein a protective layer is provided on the substrate to cover the plurality of magnetoresistive elements.

15. The magnetic sensor according to claim 1, wherein the unit patterns of two of the plurality of magnetoresistive elements have different orientations in circumferential directions of the imaginary circles.

16. The magnetic sensor according to claim 1, wherein orientations of the unit patterns of two of the plurality of magnetoresistive elements in circumferential directions of the imaginary circles differ by 90° or about 90°.

17. The magnetic sensor according to claim 1, wherein at least two of the plurality of magnetoresistive elements have same or substantially same shapes.

18. The magnetic sensor according to claim 1, wherein a number of the plurality unit patterns is one of thirty seven, seven, eight, sixteen, and thirty two.

19. The magnetic sensor according to claim 1, wherein a number of the plurality bent portions is one of four, sixteen, and fourteen.

* * * * *